(12) United States Patent
Schmitt

(10) Patent No.: US 6,288,894 B1
(45) Date of Patent: *Sep. 11, 2001

(54) OFFSET WHEELS FOR ELECTRONIC SYSTEM HOUSING

(75) Inventor: Ty R. Schmitt, Round Rock, TX (US)

(73) Assignee: Dell USA L.P., Round Rock, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/459,027

(22) Filed: Dec. 10, 1999

(51) Int. Cl.$^7$ ........................................... G06F 1/16
(52) U.S. Cl. ..................... 361/683; 361/681; 361/724; 312/216; 364/708.1
(58) Field of Search .................... 361/681–686, 361/724–727, 740, 759; 364/708.1; 248/551–553; 312/216, 218; 70/57, 58, 85; 292/42, 148, 151, 307 R

(56) References Cited

U.S. PATENT DOCUMENTS

| | | | |
|---|---|---|---|
| D. 358,132 | 5/1995 | Kimbrough et al. | D14/100 |
| D. 358,373 | 5/1995 | Heard et al. | D14/100 |
| 4,536,690 | 8/1985 | Belsterling et al. | 318/687 |
| 4,576,389 | 3/1986 | Villaveces et al. | 280/43.16 |
| 4,681,378 | 7/1987 | Hellman, III | 312/108 |
| 4,811,591 | 3/1989 | Antoine | 73/9 |
| 5,020,768 | 6/1991 | Hardt et al. | 248/678 |
| 5,113,546 | 5/1992 | Parent | 15/315 |
| 5,142,445 * | 8/1992 | Sorensen et al. | 361/681 |
| 5,263,626 | 11/1993 | Reiter | 248/346 |
| 5,349,483 * | 9/1994 | Tsai | 361/685 |
| 5,487,521 | 1/1996 | Callahan | 248/441.1 |
| 5,630,566 | 5/1997 | Case | 247/122.1 |
| 5,697,686 | 12/1997 | Miller et al. | 312/194 |
| 5,749,637 | 5/1998 | McMahan et al. | 312/223.2 |
| 5,758,935 | 6/1998 | Coonan | 312/223.3 |
| 5,765,315 | 6/1998 | Nagamitsu et al. | 52/36.1 |
| 5,875,601 | 3/1999 | Gutelius, Jr. et al. | 52/698 |
| 5,918,841 | 7/1999 | Sweere et al. | 248/123.11 |
| 5,951,179 | 9/1999 | Zarek | 400/492 |
| 5,959,834 * | 9/1999 | Chang | 361/726 |
| 5,961,134 | 10/1999 | Congleton et al. | 280/47.18 |
| 5,961,192 | 10/1999 | Bernart et al. | 312/223.3 |
| 6,122,165 * | 9/2000 | Schmitt et al. | 361/685 |

OTHER PUBLICATIONS

Ty R. Schmitt and Andrew Wilks; "Stabilizing Pedestal For Computer System Tower Units"; Filed May 2, 1997; US Serial No.: 08/850,313; 11 Pages of Specification; and 4 Sheets of Drawings. (Copy Not Enclosed).

\* cited by examiner

*Primary Examiner*—Leo P. Picard
*Assistant Examiner*—Hung Van Duong
(74) *Attorney, Agent, or Firm*—Skjerven, Morrill MacPherson LLP; David G. Dolezal

(57) ABSTRACT

An electronic system housing with offset wheels located generally outside of a perimeter of the base of the housing. In one example the wheels are mounted to brackets that extend across the base of the housing chassis with a first end of the bracket being horizontally offset from the second end of the bracket. A caster is attached to each end portion of the bracket. The horizontal offset in the wheels allows two electronic system chassis to be located adjacent to each other in an aligned configuration with wheels of the first electronic system located under the chassis of the second electronic system and the wheels of the second electronic system located under the chassis of the first electronic system. An example of an electronic system is a computer system.

19 Claims, 4 Drawing Sheets

OFFSET WHEELS FOR ELECTRONIC SYSTEM HOUSING

BACKGROUND OF THE INVENTION

1. Field of the Invention

The present invention relates in general to electronic systems and in particular to offset wheels for an electronic system housing.

2. Description of the Related Art

Computer systems are information handling electronic systems which can be designed to give independent computing power to one user or a plurality of users. Computer systems may be found in many forms including, for example, mainframes, minicomputers, workstations, servers, personal computers, internet terminals, notebooks, and embedded systems. Computer systems include desk top, floor standing, rack mounted, or portable versions. A typical computer system includes at least one system processor, associated system memory and control logic, and peripheral devices that provide input and output for the system. Examples of peripheral devices include display monitors, keyboards, mouse-type input devices, floppy and hard disk drives, CD-ROM drives, printers, network capability card circuits, terminal devices, modems, televisions, sound devices, voice recognition devices, electronic pen devices, and mass storage devices such as tape drives, CD-R drives, or DVDs.

Some computer system chassis are mounted on wheels to reduce the physical exertion required in moving the chassis. However, because the height of a chassis may be greater than the width of the chassis, the wheel base of the chassis may be wider than the width of the chassis. With some systems, the wheels are required to be located at least three inches outside the perimeter the base of the chassis.

Locating chassis wheels outside of the base perimeter of a chassis may present problems for a user who desires to position multiple chassis as close to one another as possible in that wheels prevent the chassis from being placed side-by-side in an aligned configuration. What is needed is a way to provide an electronic system chassis with a wide wheel base and yet allow multiple chassis to be located next to each other in an aligned configuration.

SUMMARY OF THE INVENTION

It has been discovered that providing electronic system housing chassis with offset wheels allows chassis with wide wheel bases to be located adjacent to each other in an aligned configuration.

In one aspect of the invention, a computer system includes a processor, a memory operably coupled to the processor, and a chassis. The processor and memory are housed in the chassis. The chassis has a base. The computer system includes a plurality of wheels physically coupled to the chassis to support the chassis. The plurality of wheels includes a first set of wheels located at a front portion of the chassis and a second set of wheels located at a back portion of the chassis. The first set of wheels includes a first wheel located out from the base of the chassis on a first side and a second wheel located out from the base of the chassis on a second side opposing the first side. The first wheel is horizontally offset from the second wheel along a dimension generally parallel to the first and second sides. The second set of wheels includes a third wheel located out from the base of the chassis on the first side and a fourth wheel located out from the base of the chassis on the second side. The third wheel is horizontally offset from the fourth wheel along the dimension.

In another aspect of the invention, a housing assembly for an electronic system includes a chassis for housing electronic components and a bracket coupled the chassis. The bracket has a first end portion and a second end portion. The first end portion extends out past a first side of the chassis. The second end portion extends out past a second side of the chassis. The second side opposes the first side. The first end portion is horizontally offset from the second end portion along a dimension generally parallel to the first and second sides. The housing assembly also includes a first caster attached to the first end portion of the bracket and a second caster attached to the second end portion of the bracket. The first caster and the second caster provide support for the chassis.

In another aspect of the invention, a computer system includes a processor, a memory operably coupled to the processor, and a chassis. The processor and memory are housed in the chassis. The computer system includes a bracket coupled to the chassis. The bracket has a first end portion and a second end portion. The first end portion extends out past a first side of the chassis. The second end portion extends out past a second side of the chassis. The second side opposes the first side. The first end portion is horizontally offset from the second end portion along a dimension generally parallel to the first and second sides. The computer system also includes a first wheel coupled to the first end portion of the bracket and a second wheel coupled to the second end portion of the bracket. The first wheel and the second wheel provide support for the chassis.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
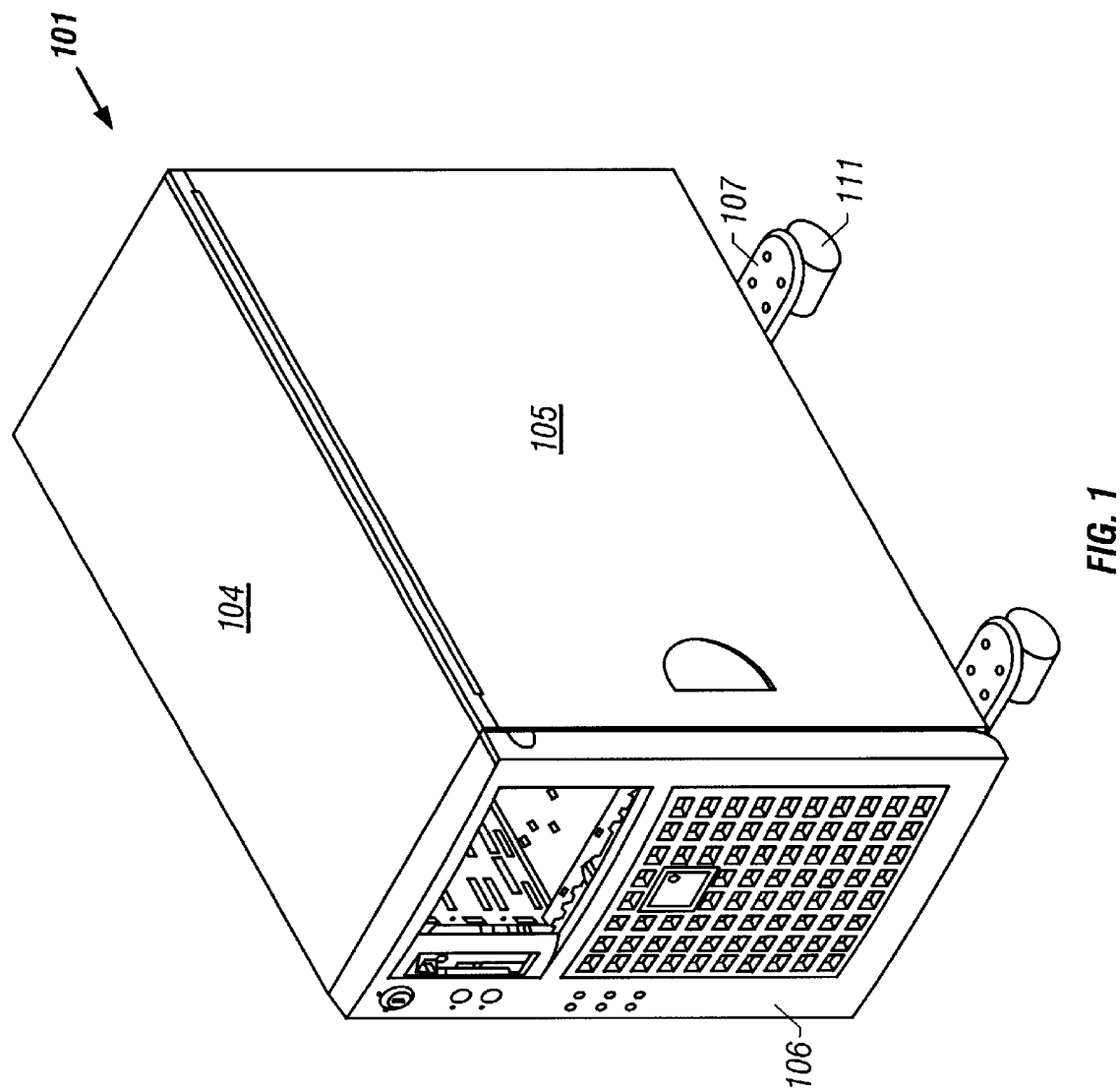
FIG. 1 is an example of a electronic system chassis with an offset wheels according to the present invention.

FIG. 1 is a perspective view of a computer system chassis according to the present invention. Computer system chassis includes top panel 104, side panels 105, and front bezel 106. Not shown in FIG. 1 are a bottom panel (e.g., 320 in FIG. 3) a back panel, or interior chassis frame members. Chassis 101 is movable and is supported on a wheel base that includes four casters 111 that are located outside of the perimeter of the base of chassis 101 (two of the four casters are shown in FIG. 1). One example of a computer system is the POWER EDGE 2400™ sold by the DELL COMPUTER CORP.

Figure 2:
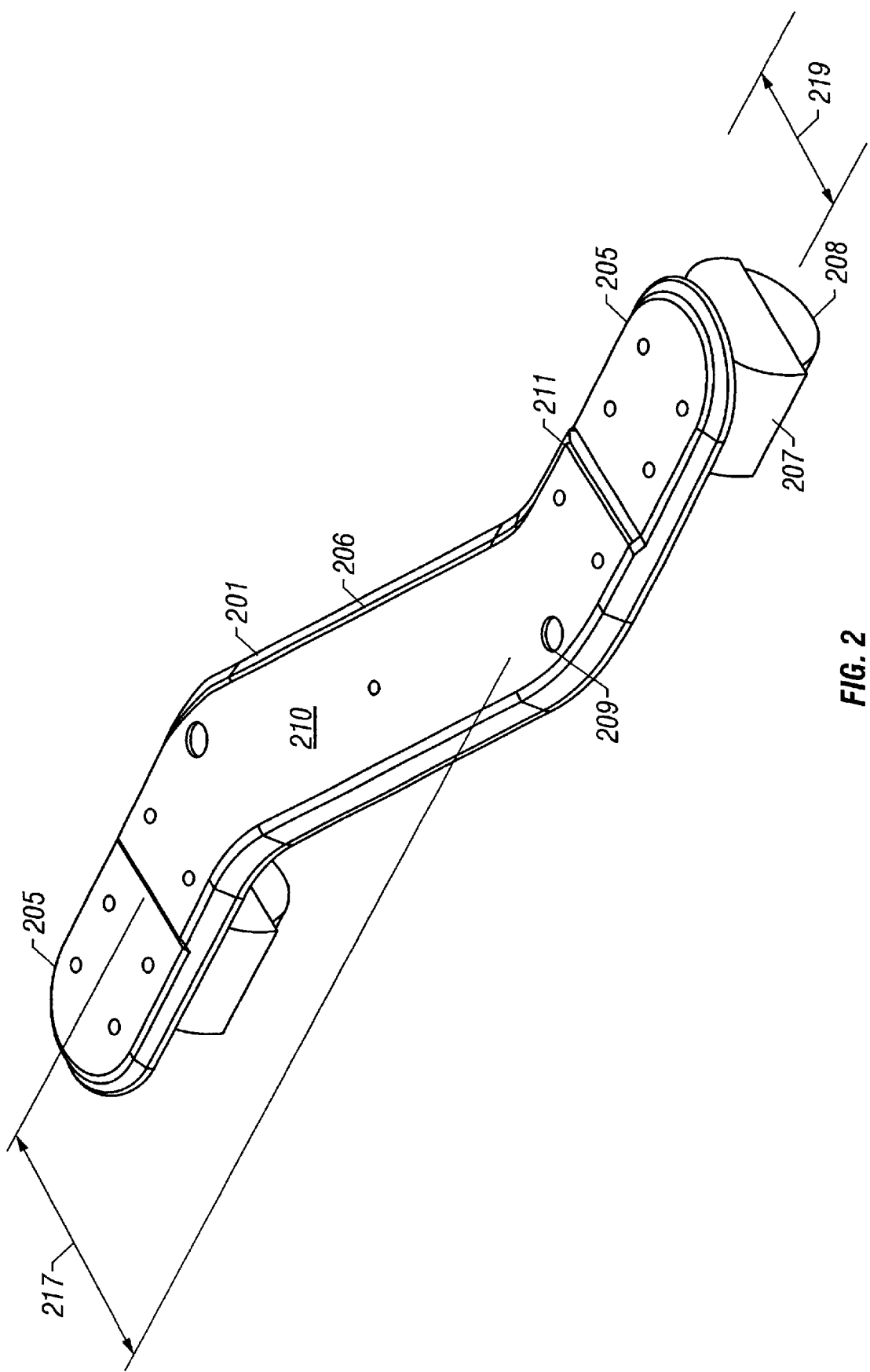
FIG. 2 is an example of a bracket having an offset according to the present invention.

FIG. 2 is a perspective view of an example of a bracket having an offset according to the present invention. Bracket 201 includes two end portions 205 and a middle portion 206 having an offset. Casters 207, which include wheels 208, are attached to each end portion 205 with bolts but may be attached in other ways, e.g., rivets, screws, or by welding. The middle portion 206 includes two bolt holes 209 for mounting bracket 201 to a computer chassis (e.g., 101). The top surface 210 of bracket 201 has a vertical offset 211 at each end portion 205 that provides clearance for each end portion to be positioned beneath an adjacent computer system chassis (see FIG. 3).

As shown in FIG. 2, end portions 205 of bracket 201 are horizontally offset from each other by a distance 217 that is greater than the width 219 of each end portion 205.

Bracket 201 is made from a sheet of galvanized steel that is cut, pressed, and folded together along the bottom side. (See seam 340 on FIG. 3). However, a bracket according to the present invention may be formed from other material and/or other techniques. For example, a bracket may be made of separately formed pieces or be made of a solid structure.

Figure 3:
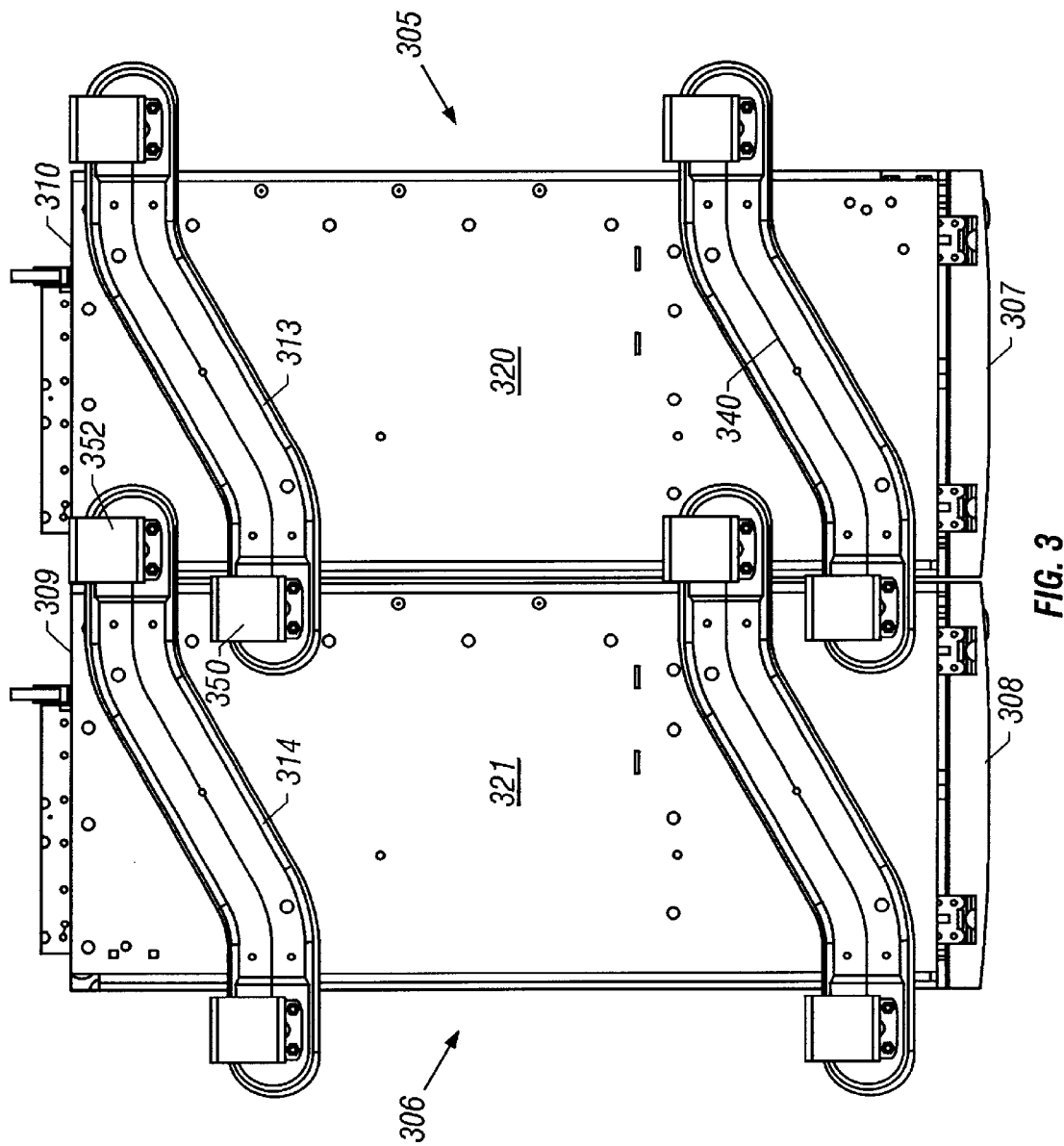
FIG. 3 is a bottom view of two computer system chassis positioned adjacent to each other in an aligned configuration according to the present invention.

FIG. 3 is a bottom view of computer chassis 305 and 306 located side-by-side in an aligned configuration. In the aligned configuration of FIG. 3, the front sides 307 and 308 and back sides 309 and 310 are in alignment. Two brackets 313 are attached to the bottom panel 320 of computer chassis 305 and two brackets 314 are attached to bottom panel 321 of computer chassis 306. In one example, brackets 313 and 314 are bolted to their respective bottom chassis panels. However, the brackets may be attached to other structures of the chassis and/or by other techniques such as, e.g., rivets, screws, or welding.

As shown in FIG. 3, the offsets (having horizontal dimensions) in brackets 313 and 314 allow the end portions of the brackets and casters to fit beneath an adjacent computer system chassis when the chassis are placed side by side in an aligned configuration. For example, caster 350, which is coupled to chassis 305, is shown located under chassis 306, and caster 352, which is coupled to chassis 306, is shown located under chassis 305.

Figure 4:
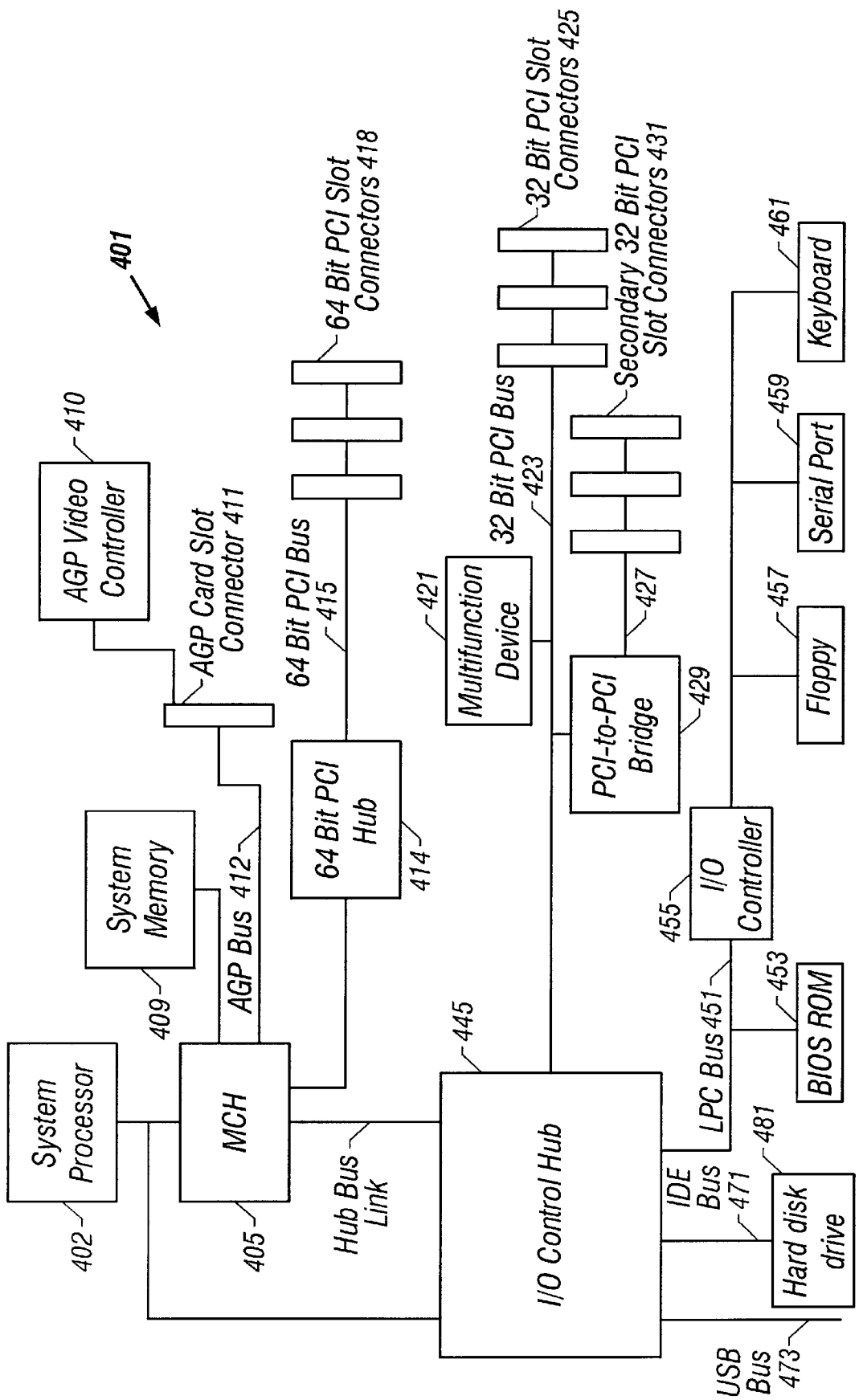
FIG. 4 is a block diagram of an example of a computer system.

FIG. 4 is a block diagram of an example of a computer system that can be implemented in a chassis having offset wheels according to the present invention. Computer system 401 includes a system processor 402 such as, e.g., a PENTIUM III processor sold by INTEL™. System memory 409 is operably coupled to system processor 402 via memory control hub (MCH) 405, which in one embodiment is implemented with a 440BX chipset sold by INTEL™.

Computer system 401 includes a number of computer busses conforming to various computer bus standards that enable system processor 402 to be operably coupled to multiple computer devices. Computer bus 415 is a 64 bit computer bus conforming to a Peripheral Component Interface (PCI) Local Bus Specification, such as, e.g., the PCI Local Bus Specification, Rev. 2.2. 64 bit PCI card slot connectors 418 are located on computer bus 415 and are operably coupled to memory control hub 405 via 64 bit PCI hub 414. Computer bus 423 is a 32 bit computer bus conforming to a PCI specification. Located on PCI computer bus 423 are PCI card slot connectors 425. Computer bus 423 is operably coupled to system processor 402 via I/O control hub 445. In one example, I/O control hub 445 is implemented with a PIIX4 chip sold by INTEL™. Computer system 401 also includes a secondary 32 bit PCI computer bus 427 operably coupled to computer bus 423 via a PCI-to-PCI bridge 429 with 32 bit PCI card slots 431 located on secondary bus 427. A number of computer PCI compliant devices may be operably coupled to PCI busses 415, 423, and 427 including devices (not shown) located on computer cards inserted into card slot connectors 418, 425, and 431. Such devices include e.g., remote access circuits such as, e.g., LAN connector circuits and modem circuits and sound card circuits. Computer system 401 includes a PCI compliant multifunction device 421 located on PCI bus 423. Multifunction device 421 includes multiple devices (functions) that are operably coupled to system processor 402 via PCI bus 423. Examples of devices implemented in a multifunction device include e.g., SCSI controllers, ethernet controllers, and audio controllers.

Computer system 401 also includes computer bus 451 which conforms to the Low Pin Count (LPC) bus standard. LPC computer bus 451 is operably coupled to system processor 402 via I/O control hub 445. Operably coupled to LPC computer bus 451 are BIOS ROM 453 and I/O controller 455. Operably coupled to the I/O controller 455 are floppy disk drive 457, serial port 459, and keyboard 461 (which is typically implemented in a separate housing for a stand alone version). Computer system 401 also includes a computer bus 471 conforming to the Integrated Drive Electronics (IDE) standard and a computer bus 473 conforming to the Universal Serial Bus (USB) standard. A hard disk drive 481 is located on the IDE bus 471. Hard disk drive 481 stores application and operating system code. A video controller 410 conforming to the Advanced Graphics Port Specification (AGP video controller) is mounted on a computer card (not shown) that is inserted into AGP card slot connector 411 which is operably coupled to memory control hub 405 via AGP bus 412. Other conventional computer devices (not shown) may be coupled via the computer busses and may be located either on computer cards or mounted to a system board of computer system 401. Those of skill in the art will recognize that, based upon the teachings herein, computer systems of different forms and configurations may be mounted in a chassis having offset wheels according to the present invention.

Those of skill in the art will recognize that, based upon the teachings herein, several modifications may be made to the embodiments shown in FIGS. 1–4 and described herein. For example, each wheel may be coupled to a chassis via a separate bracket attached to an electronic system chassis. Also, the wheels may be coupled to a chassis in other configurations. While particular embodiments of the present invention have been shown and described, it will be recognized to those skilled in the art that, based upon the teachings herein, firther changes and modifications may be made without departing from this invention and its broader aspects, and thus, the appended claims are to encompass within their scope all such changes and modifications as are within the true spirit and scope of this invention.

What is claimed is:

1. A computer system comprising:

a processor;

a memory operably coupled to the processor;

a chassis, the processor and memory housed in the chassis, the chassis having a base;

a plurality of wheels physically coupled to the chassis to support the chassis;

wherein the plurality of wheels includes a first set of wheels located at a front portion of the chassis and a second set of wheels located at a back portion of the chassis;

wherein the first set of wheels includes a first wheel located out from the base of the chassis on a first side and a second wheel located out from the base of the chassis on a second side opposing the first side, the first wheel is horizontally offset from the second wheel along a dimension generally parallel to the first and second sides;

wherein the second set of wheels includes a third wheel located out from the base of the chassis on the first side and a fourth wheel located out from the base of the chassis on the second side, the third wheel is horizontally offset from the fourth wheel along the dimension.

2. The computer system of claim 1 firther comprising:
a bracket rigidly coupled to the chassis and extending across the base of the chassis from the first side to the second side, the first wheel is coupled to a first end portion of the bracket extending out from the first side of the chassis and the second wheel is coupled to a second end portion of the bracket extending out from the second side of the chassis;

wherein the first end portion of the bracket is horizontally offset along the dimension from the second end portion of the bracket.

3. The computer system of claim 2 wherein:
the chassis further includes a base panel;
the bracket is attached to the base panel.

4. The computer system of claim 2 wherein the first end portion of the bracket has a width generally parallel with the dimension, wherein the horizontal offset along the dimension between the first end portion and the second end portion is greater than the width of the first end portion.

5. The computer system of claim 1 wherein the wheels of the plurality are implemented in casters physically coupled to the chassis.

6. A method for positioning a first computer system according to claim 1 adjacent to a second computer system according to claim 1, the method comprising:
placing the chassis of the first computer system in an aligned position adjacent to the chassis of the second computer system with the first side of the chassis of the first computer system facing the second side of the chassis of the second computer system, wherein the placing includes placing the first and third wheels of the first computer system at least partially under the base of the second computer system and placing the second and fourth wheels of the second computer system at least partially under the base of the first computer system.

7. A housing assembly for an electronic system comprising:
a chassis for housing electronic components;
a bracket coupled the chassis, the bracket having a first end portion and a second end portion, the first end portion extending out past a first side of the chassis, the second end portion extending out past a second side of the chassis, the second side opposing the first side, the first end portion is horizontally offset from the second end portion along a dimension generally parallel to the first and second sides;
a first caster attached to the first end portion of the bracket;
a second caster attached to the second end portion of the bracket;
wherein the first caster and the second caster provide support for the chassis.

8. The housing assembly of claim 7 wherein the bracket is integrally formed.

9. A method for positioning a first housing assembly according to claim 7 adjacent to a second housing assembly according to claim 7, the method comprising:
placing the chassis of the first computer system in an aligned position adjacent to the chassis of the second computer system with the first side of the chassis of the first computer system facing the second side of the chassis of the second computer system, wherein the placing includes placing the first end portion of the bracket of the first computer system at least partially under the chassis of the second computer system and placing the second end portion of the bracket of the second computer system at least partially under the chassis of the first computer system.

10. The housing assembly of claim 7 further comprising:
a second bracket coupled to the chassis, the second bracket having a first end portion and a second end portion, the first end portion extending out past the first side of the chassis, the second end portion extending out past the second side of the chassis, the first end portion is horizontally offset from the second end portion along the dimension;
a third wheel coupled to the first end portion of the second bracket;
a fourth wheel coupled to the second end portion of the second bracket;
wherein the third wheel and the fourth wheel provide support for the chassis.

11. The housing assembly of claim 7 wherein the first end portion of the bracket has a width generally parallel with the dimension, wherein the horizontal offset along the dimension between the first end portion and the second end portion is greater than the width of the first end portion.

12. A computer system comprising:
a processor;
a memory operably coupled to the processor;
a chassis, the processor and memory housed in the chassis;
a bracket coupled to the chassis, the bracket having a first end portion and a second end portion, the first end portion extending out past a first side of the chassis, the second end portion extending out past a second side of the chassis, the second side opposing the first side, the first end portion is horizontally offset from the second end portion along a dimension generally parallel to the first and second sides;
a first wheel coupled to the first end portion of the bracket;
a second wheel coupled to the second end portion of the bracket;
wherein the first wheel and the second wheel provide support for the chassis.

13. The computer system of claim 12 further comprising:
a second bracket coupled to the chassis, the second bracket having a first end portion and a second end portion, the first end portion extending out past the first side of the chassis, the second end portion extending out past the second side of the chassis, the first end portion is horizontally offset from the second end portion along the dimension;
a third wheel coupled to the first end portion of the second bracket;
a fourth wheel coupled to the second end portion of the second bracket;
wherein the third wheel and the fourth wheel provide support for the chassis.

14. The computer system of claim 12 wherein:
the first wheel is implemented in a first caster attached to the first end portion;
the second wheel is implemented in a second caster attached to the second end portion.

15. The computer system of claim 12 wherein:
the chassis further includes a bottom panel;
the bracket is attached to the bottom panel.

16. The computer system of claim 12 wherein the first end portion of the bracket has a width generally parallel with the dimension, wherein the horizontal offset along the dimension between the first end portion and the second end portion is greater than the width of the first end portion.

17. A method for positioning a first computer system according to claim 12 adjacent to a second computer system according to claim 12, the method comprising:
placing the chassis of the first computer system in an aligned position adjacent to the chassis of the second computer system with the first side of the chassis of the first computer system facing the second side of the chassis of the second computer system, wherein the placing includes placing the first end portion of the bracket of the first computer system at least partially under the chassis of the second computer system and placing the second end portion of the bracket of the second computer system at least partially under the chassis of the first computer system.

18. The computer system of claim 12 wherein the first bracket futher comprises a middle portion located between the first and second end portions, wherein the top sides of the end portions is vertically offset from the middle portion and resides at a lower elevation than the top side of the middle portion.

19. The computer system of claim 12 wherein the bracket is integrally formed.

* * * * *